United States Patent
Eberlein et al.

(10) Patent No.: US 9,207,691 B2
(45) Date of Patent: Dec. 8, 2015

(54) CONTROL APPARATUS FOR SEMICONDUCTOR SWITCHES OF AN INVERTER, AND METHOD FOR DRIVING AN INVERTER

(71) Applicant: Robert Bosch GmbH, Stuttgart (DE)

(72) Inventors: Edwin Eberlein, Stuttgart (DE); Andreas Schoenknecht, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 333 days.

(21) Appl. No.: 13/908,298

(22) Filed: Jun. 3, 2013

(65) Prior Publication Data

US 2013/0321037 A1   Dec. 5, 2013

(30) Foreign Application Priority Data

Jun. 1, 2012 (DE) .......................... 10 2012 209 276

(51) Int. Cl.
*H02P 27/04* (2006.01)
*G05F 1/10* (2006.01)

(52) U.S. Cl.
CPC ....................................... *G05F 1/10* (2013.01)

(58) Field of Classification Search
USPC .............. 318/75, 400.17, 400.26, 756, 254.1, 318/400.2
See application file for complete search history.

(56) References Cited

U.S. PATENT DOCUMENTS

| | | | |
|---|---|---|---|
| 8,872,455 B2 * | 10/2014 | Tremel et al. | ............ 318/400.22 |
| 2005/0231171 A1 | 10/2005 | Kato et al. | |
| 2009/0200971 A1 * | 8/2009 | Iwaji et al. | ............... 318/400.11 |
| 2011/0221374 A1 * | 9/2011 | Maebara et al. | ............... 318/494 |

* cited by examiner

*Primary Examiner* — Eduardo Colon Santana
*Assistant Examiner* — Iftekhar Mustafa
(74) *Attorney, Agent, or Firm* — Michael Best & Friedrich LLP

(57) ABSTRACT

A control apparatus for driving a semiconductor switch of an inverter. A drive circuit generates a driver signal on the basis of a switching signal generated by a control regulation system of the inverter. A driver circuit which is coupled between the drive circuit and a control input of the semiconductor switch is configured to receive the driver signal and to generate, on the basis of the driver signal, a control signal which drives the semiconductor switch. The control signal is fed into the control input of the semiconductor switch. A regulation circuit is coupled to the drive circuit and is configured to detect a voltage signal dependent on the voltage across the semiconductor switch, to generate a regulation signal which is dependent on the voltage signal and is intended to regulate the driver signal, and to feed the regulation signal into the drive circuit.

11 Claims, 3 Drawing Sheets

FIG. 4
FIG. 5
FIG. 6
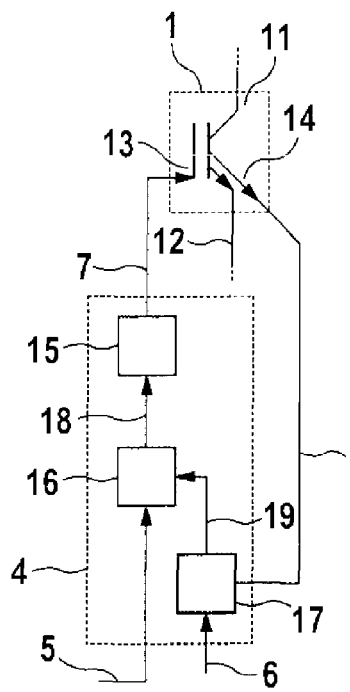
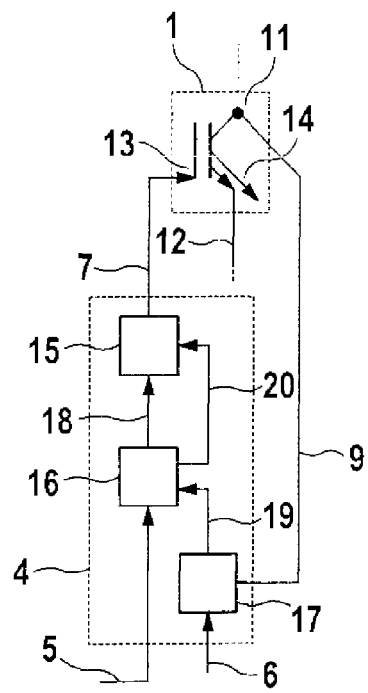
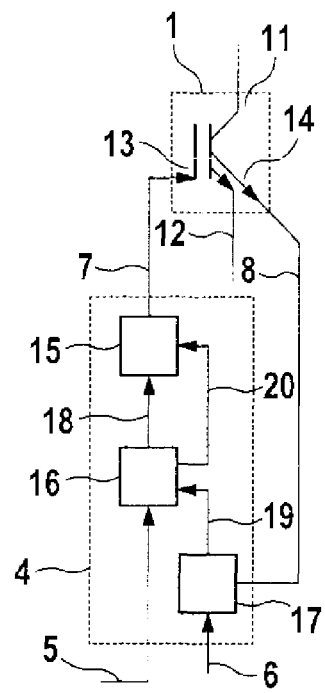
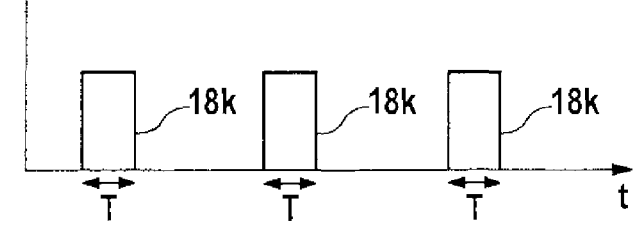
FIG. 7
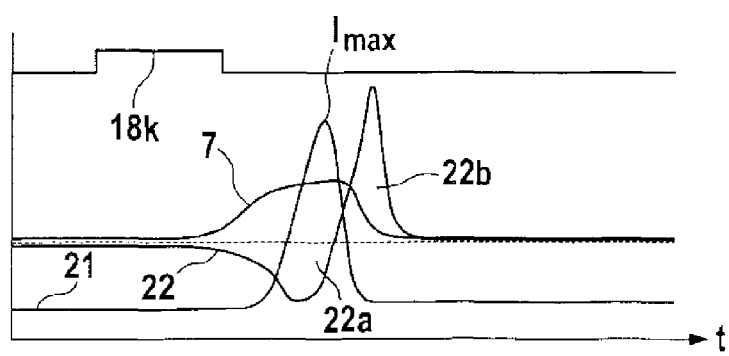
FIG. 8

CONTROL APPARATUS FOR SEMICONDUCTOR SWITCHES OF AN INVERTER, AND METHOD FOR DRIVING AN INVERTER

BACKGROUND OF THE INVENTION

The invention relates to a control apparatus for semiconductor switches of an inverter and to a method for driving an inverter, in particular for operating an inverter in a rapid discharge mode.

Electric and hybrid vehicles often have power-electronic circuit components in the drive system between the traction battery and the electrical machine which are generally constructed as voltage intermediate circuit converters. In this case, a DC voltage intermediate circuit is used as a coupling element between the traction battery and an inverter which can be driven to transmit electrical power from the DC voltage intermediate circuit to the electrical machine.

Inverters may be in the form, for example, of a full-bridge circuit having a number of bridge branches with two semiconductor switches each. In this case, those semiconductor switches of the bridge branches which are connected to a first output connection of the DC voltage intermediate circuit may each be referred to as high-side switches and those semiconductor switches of the bridge branches which are connected to the second output connection of the DC voltage intermediate circuit may each be referred to as low-side switches. In this case, IGBT modules (bipolar transistors with an insulated gate electrode) with a diode reverse-connected in parallel or MOSFETs (metal oxide field effect transistors), for example, can be used as the semiconductor switches.

Control regulation systems which generate switching signals for the semiconductor switches are used to drive the inverter. In the event of a fault, different requirements are imposed on the control regulation systems for reasons of safety. For example, it may be necessary to safely short-circuit the motor windings of the electrical machine in the event of a fault. This may be effected by closing all high-side switches and opening all low-side switches (or vice versa), which is also referred to as an "active short circuit".

In addition, in the event of a fault, it is necessary to rapidly and reliably discharge the DC voltage intermediate circuit, in particular also when supply voltages in the control regulation system fail. This may be effected by means of a rapid discharge. Such a rapid discharge is normatively required within a maximum rapid discharge time of five seconds in order to be able to ensure the electrical operational reliability of the vehicle.

The document US 2005/0231171 A1 discloses an electrical drive system having an electric motor, a pulse-controlled inverter and an intermediate circuit capacitor. The intermediate circuit capacitor can be discharged in a controlled manner via a corresponding switch mode of the pulse-controlled inverter.

SUMMARY OF THE INVENTION

According to one aspect, the present invention provides a control apparatus for driving a semiconductor switch of an inverter, having a drive circuit which is designed or configured to generate a driver signal on the basis of a switching signal generated by a control regulation system of the inverter, and a driver circuit which is coupled between the drive circuit and a control input of the semiconductor switch and is designed to receive the driver signal and to generate, on the basis of the driver signal, a control signal which drives the semiconductor switch and to feed said control signal into the control input of the semiconductor switch, and a regulation circuit which is coupled to the drive circuit and is designed to detect a voltage signal dependent on the voltage dropped across the semiconductor switch during switching-off of the semiconductor switch, to generate a regulation signal which is dependent on the voltage signal and is intended to regulate the driver signal, and to feed the regulation signal into the drive circuit.

According to another aspect, the present invention provides a drive system for an n-phase electrical machine, where n≥1, having an intermediate circuit capacitor which is connected to two input voltage connections, an inverter having a multiplicity of semiconductor switches, which inverter is coupled to the intermediate circuit capacitor, is fed with electrical energy from the intermediate circuit capacitor and is designed to generate an n-phase supply voltage for the electrical machine, a multiplicity of control apparatuses according to the invention which are each designed to generate a switching control signal for one of the semiconductor switches of the inverter, and a control regulation system which is coupled to the multiplicity of control apparatuses and is designed to generate switching signals for the semiconductor switches of the inverter.

According to another aspect, the present invention provides a method for driving an inverter, having the steps of generating a driver signal for at least one of the semiconductor switches of the inverter, the driver signal having a sequence of driver signal pulses, amplifying the driver signal in order to generate a control signal which drives the at least one semiconductor switch, detecting a voltage signal dependent on the voltage dropped across the semiconductor switch during switching-off of the semiconductor switch, generating a regulation signal dependent on the voltage signal, and regulating the driver signal by means of the regulation signal.

Advantages of the Invention

One idea of the present invention is to provide a control apparatus for semiconductor switches of an inverter in an electrically operated vehicle, which control apparatus can implement a reliable and robust rapid or emergency discharge. In this case, the commutation current through a half-bridge branch of the inverter is determined by detecting and evaluating the profile of a voltage signal across the half-bridge branch or one of the semiconductor switches. Feedback of the detected commutation current can be used, on the one hand, to carry out fine adjustment of the discharge circuit and, on the other hand, to implement different diagnostic and monitoring mechanisms for checking and ensuring the proper functionality of the discharge circuit. In this case, the rapid or emergency discharge is carried out using semiconductor switches which are present in the inverter anyway and at which the required voltage signals can also be tapped off. This dispenses with the need to provide dedicated emergency discharge circuits or diagnostic circuits, which can entail a considerable saving in terms of costs and installation space.

One advantage of the invention is that an inverter which is configured with a control apparatus according to the invention and comprises a multiplicity of bridge branches each with two semiconductor switches can be driven in such a manner that one of the semiconductor switches of a particular number of bridge branches is respectively "clocked", that is to say the drive signal consists of short drive pulses, the pulse length of which is selected to be just so short that the semiconductor switch is not yet switched to be completely conductive but rather is briefly in a transition state between the switched-off state and the conductive state. During this time, energy from the intermediate circuit capacitor can be converted into heat when a current flows through the respective semiconductor switches and the voltage in the intermediate circuit can thus be rapidly and effectively reduced. This provides the advantage that an intermediate circuit capacitor connected to the input connections of the inverter can be rapidly and reliably discharged via the semiconductor switches without currents flowing through a connected electrical machine as a result of the discharge.

In this case, it is particularly advantageous that, on the one hand, no further circuit components for discharging the intermediate circuit capacitor must be installed, which saves space and production costs. On the other hand, the semiconductor switches are thermally connected to the environment in a very effective manner anyway, with the result that discharge of the intermediate circuit capacitor via the inverter does not cause overheating of the drive system.

The drive pulses and their duration can advantageously be minimized by taking into account the voltage signals via a feedback loop. In this case, the voltage signals can also be used to check the plausibility of the functionality of the control apparatus by carrying out, for example, a predefined function program, for example a rapid discharge mode, and checking whether the detected voltage signals are in an expected or plausible range. Monitoring in the regular rapid discharge mode also makes it possible to ensure that the intermediate circuit voltage is functionally reduced and is not outside the expected voltage range on account of a defect of the control apparatus or other components, for example a contactor which cannot be opened.

According to one embodiment of the control apparatus according to the invention, the drive circuit can be designed to generate the driver signal in the form of a sequence of driver signal pulses with an adjustable pulse length, with the result that the semiconductor switch is not completely conductive when driven with the control signal during the pulse length.

According to another embodiment of the control apparatus according to the invention, the pulse length can be adjustable on the basis of the voltage signal in such a manner that the semiconductor switch has a predetermined current value when driven with the control signal.

According to another embodiment of the control apparatus according to the invention, the voltage signal can be detectable at a collector connection of the semiconductor switch or via a bridge branch of the inverter.

According to another embodiment of the control apparatus according to the invention, the regulation circuit can be designed to integrate the voltage signal during switching-off of the semiconductor switch, to determine a maximum current intensity, on the integrated voltage signal, through the semiconductor switch, and to output the regulation signal on the basis of the difference between the maximum current intensity determined and a predefinable desired value for the maximum current intensity.

According to another embodiment of the control apparatus according to the invention, the driver circuit may have an adjustable control resistance for generating the control signal, and the drive circuit may be designed to generate an actuating signal for adjusting the adjustable control resistance on the basis of the regulation signal and to feed said actuating signal into the driver circuit.

According to another embodiment of the control apparatus according to the invention, the control apparatus can be designed to drive an IGBT switch.

According to another embodiment of the control apparatus according to the invention, the inverter may have a half-bridge circuit. In this case, the drive circuit may be designed to drive one of the semiconductor switches of a half-bridge with the driver signal and to permanently close the other semiconductor switch of the half-bridge. This is particularly advantageous for implementing an active short circuit of the inverter, during which energy from the intermediate circuit capacitor is converted into heat when a current flows through one of the respective semiconductor switches of a half-bridge and the voltage in the intermediate circuit can thus be rapidly and effectively reduced.

According to one embodiment of the drive system according to the invention, the drive system may also comprise a sensor circuit which is coupled to the control regulation system and is designed to detect the phase currents for the electrical machine which are output by the inverter, the control regulation system also being designed or configured to compare the detected phase currents with the voltage signals dependent on the voltages dropped across the semiconductor switches and to drive the regulation circuits of the multiplicity of control apparatuses on the basis of the comparison in order to adjust the regulation signals. This makes it possible to advantageously use a phase current sensor system for comparison with the voltage signals at the semiconductor switches. This increases the accuracy of the regulation circuit since the phase current sensor system can provide more accurate values for the phase currents, in particular in the normal mode of the drive system.

According to one embodiment of the method according to the invention, the driver signal pulses may each have a predetermined and adjustable pulse length, with the result that the semiconductor switch is not completely conductive when driven with the control signal during the pulse length.

According to another embodiment of the method according to the invention, the voltage signal can be detected at a collector connection of the semiconductor switch or via a bridge branch of the inverter.

According to another embodiment of the method according to the invention, the generation of the regulation signal may comprise integrating the voltage signal during switching-off of the semiconductor switch, determining a maximum current intensity, on the integrated voltage signal, through the semiconductor switch, and generating the regulation signal on the basis of the difference between the maximum current intensity determined and a predefinable desired value for the maximum current intensity.

According to another embodiment of the method according to the invention, the method may also comprise the steps of detecting the phase currents for the electrical machine which are output by the inverter, comparing the detected phase currents with the voltage signals dependent on the voltages dropped across the semiconductor switches, and adjusting the regulation signal on the basis of the comparison.

Further features and advantages of embodiments of the invention emerge from the following description with reference to the accompanying drawings.

BRIEF DESCRIPTION OF THE DRAWINGS

In the drawings:

FIG. 4 shows a schematic illustration of a control apparatus for a semiconductor switch according to another embodiment of the invention;

FIG. 5 shows a schematic illustration of a control apparatus for a semiconductor switch according to another embodiment of the invention;

FIG. 6 shows a schematic illustration of a control apparatus for a semiconductor switch according to another embodiment of the invention;

FIG. 7 shows a schematic illustration of a signal diagram of a control signal for a semiconductor switch according to another embodiment of the invention;

FIG. 8 shows a schematic illustration of a current and voltage diagram during operation of the control apparatus according to another embodiment of the invention;

DETAILED DESCRIPTION

Figure 1:
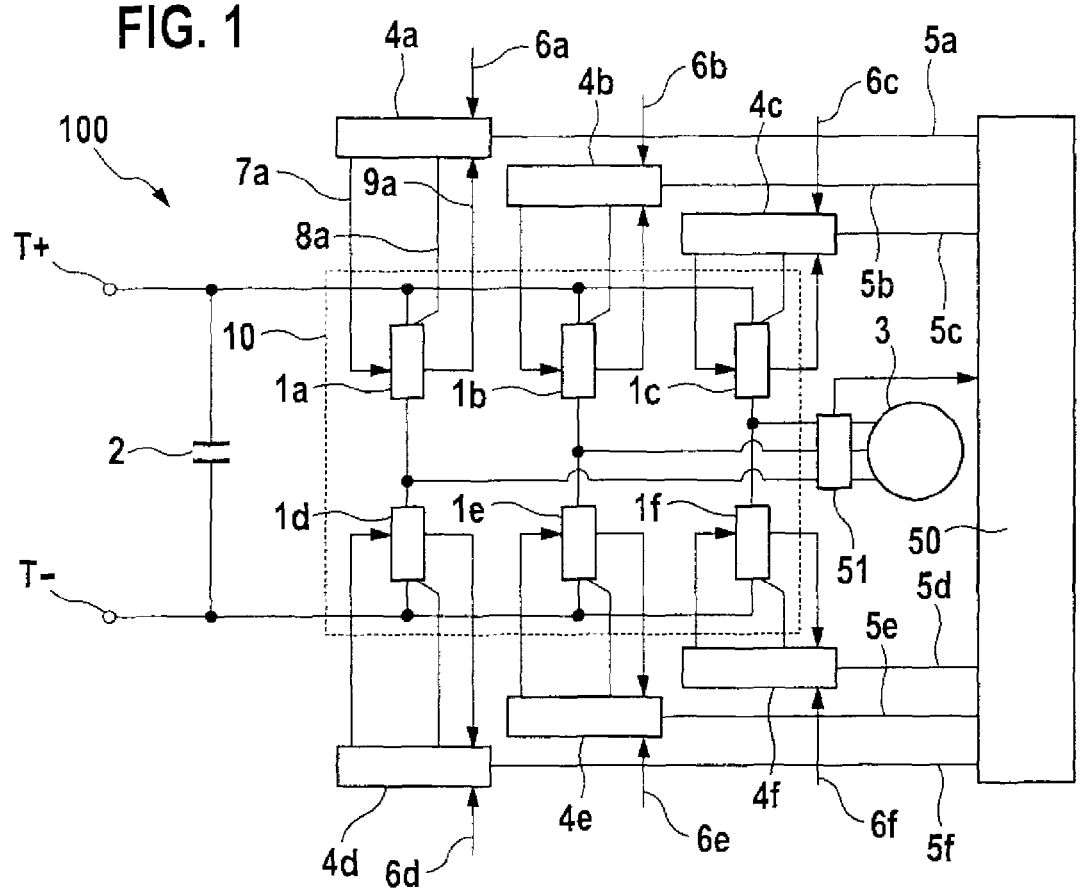
FIG. 1 shows a schematic illustration of an electrical drive system of a vehicle according to one embodiment of the invention.

FIG. 1 shows a schematic illustration of an electrical drive system 100 of a vehicle. The electrical drive system 100 comprises two input connections T+ and T− which can be supplied with high voltage, for example by means of an energy storage device such as a high-voltage battery or traction battery of the vehicle. The input connections T+ and T− are connected to a DC voltage intermediate circuit having an intermediate circuit capacitor 2. The intermediate circuit capacitor 2 is connected, via output connections, to input connections of an inverter 10, for example a pulse-controlled inverter 10. The voltage intermediate circuit converter which is illustrated in FIG. 1 and has the intermediate circuit capacitor 2 and the inverter 10 is illustrated, by way of example, in the form of a three-phase converter, that is to say the inverter 10 comprises three bridge branches each with two semiconductor switches. The first bridge branch comprises, for example, the semiconductor switches 1a and 1d, the first bridge branch comprises, for example, the semiconductor switches 1b and 1e and the third bridge branch comprises, for example, the semiconductor switches 1c and 1f. In this case, the semiconductor switches 1a, 1b, 1c on one bridge side are referred to as high-side switches and the semiconductor switches 1d, 1e, 1f on the other bridge side are referred to as low-side switches. In this case, it should be clear that any other number of bridge branches or phases of the voltage intermediate circuit converter is likewise possible and that the designation of the semiconductor switches 1a to 1f as high-side and low-side switches is selected only by way of example.

In this case, the semiconductor switches 1a to 1f illustrated in FIG. 1 may have field effect transistors (FETs), for example. In one possible embodiment, the semiconductor switches are each IGBTs (insulated gate bipolar transistors), but it is likewise possible to provide other semiconductor switches in a corresponding form, for example in the form of JFETs (junction field effect transistors) or MOSFETs (metal oxide semiconductor field effect transistors). If the semiconductor switches 1a to 1f have IGBT switches, provision may be made to reverse-connect a diode (not illustrated in FIG. 1 for reasons of clarity) in parallel with each of the IGBT switches.

The electrical drive system 100 also has a control regulation system 50 which is designed to generate switching signals 5a to 5f which code switching driving of the semiconductor switches 1a to 1f. In this case, the switching signals 5a to 5f may have, for example, a logically low level when the semiconductor switches 1a to 1f are intended to be open and may have a logically high level when the semiconductor switches 1a to 1f are intended to be closed. The control regulation system 50 feeds the switching signals 5a to 5f into corresponding control apparatuses 4a to 4f which are each responsible for driving one of the semiconductor switches 1a to 1f.

The system 100 also comprises a sensor circuit 51, for example a phase current sensor system, which is coupled to the control regulation system 50 and is designed to detect the phase currents for the electrical machine 3 which are output by the inverter 10. In a normal mode of the electrical machine 3 in particular, the control regulation system 50 can then compare the detected phase currents with the voltages dropped across the semiconductor switches 1a to 1f. As a result of this comparison, the control apparatuses 4a to 4f can be adjusted in a more accurate manner on the basis of the comparison. In this case, in interaction with the voltage measurement in the control apparatuses 4a to 4f, the sensor circuit 51 or phase current sensor system implements a plausibility check and comparison procedure which can be used for monitoring and diagnostic purposes.

The coupling of the control apparatus 4a to the associated semiconductor switch 1a is explained below, each of the other control apparatuses 4b to 4f being able to be coupled in a corresponding manner.

The control apparatus 4a has a control output which can be used to emit a control signal 7a to a control input of the semiconductor switch 1a in order to control the operation of the semiconductor switch 1a. The control apparatus 4a can detect measurement signals 8a and/or 9a via measuring lines. The measurement signal 8a may be, for example, a current measurement signal 8a which indicates an instantaneous current intensity through the semiconductor switch 1a. For this purpose, the measuring line which is used to detect the measurement signal 8a may be coupled to a current measuring output of the semiconductor switch 1a, for example. The measurement signal 9a may be, for example, a first voltage signal 9a which indicates an instantaneous voltage at a connection of the semiconductor switch 1a. For this purpose, the measuring line which is used to detect the first voltage signal 9a may be coupled, for example, to a collector connection of the semiconductor switch 1a, in particular if the semiconductor switch 1a is an IGBT switch.

FIGS. 2 to 6 show schematic illustrations of control apparatuses 4 for a semiconductor switch 1. In particular, FIGS. 2 to 6 show exemplary embodiments of the control apparatuses 4a to 4f and the associated semiconductor switches 1a to 1f in more detail. The reference symbols used in FIGS. 2 to 6 may each be provided in this case with letters from a to f in order to indicate the respective components of the electrical drive system 100 shown in FIG. 1.

The control apparatuses 4 shown in FIGS. 2 to 6 are generally used to drive a semiconductor switch 1, in particular a semiconductor switch 1 of an inverter, for example of the inverter 10 in FIG. 1. The semiconductor switch 1 is shown in FIGS. 2 to 6, by way of example, in the form of an IGBT switch having a collector connection 11, an emitter connection 12, a gate or control input 13 and a current sensor output

14. The current sensor output 14 can be used to emit a current measurement signal 8 which indicates the current intensity of a current instantaneously flowing through the IGBT switch 1. The IGBT switch 1 can be driven in different operating modes via the control input 13 by applying a corresponding control signal 7 with a particular voltage level. In a switching mode, the IGBT switch 1 can be operated only in an off-state or saturation range, that is to say the IGBT switch 1 is either completely off or completely conductive. In contrast, in a linear or active mode, the IGBT switch 1 can be operated in an amplification range, that is to say the current intensity of a current through the IGBT switch 1 scales in proportion or substantially in proportion to the voltage applied to the control connection.

Figure 2:
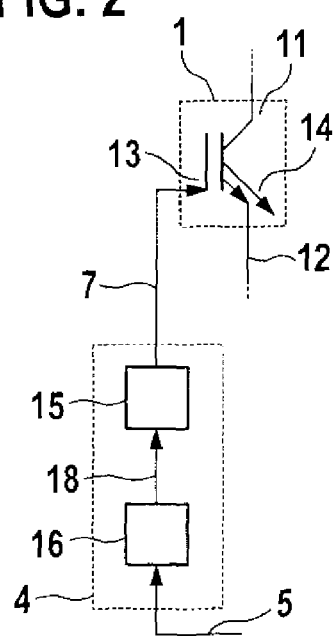
FIG. 2 shows a schematic illustration of a control apparatus for a semiconductor switch according to another embodiment of the invention.
Figure 3:
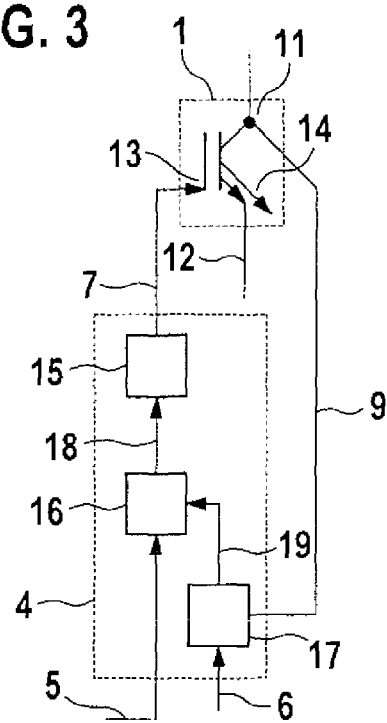
FIG. 3 shows a schematic illustration of a control apparatus for a semiconductor switch according to another embodiment of the invention.

In the exemplary embodiment shown in FIG. 2, the control apparatus 4 has a drive circuit 16 which is designed to generate a driver signal 18 on the basis of a switching signal 5 generated by a control regulation system of an inverter. In this case, in a conventional switching mode of the inverter, the driver signal 18 may substantially correspond to the switching signal 5. The switching signal 5 may have, for example, a logically high level when the IGBT switch 1 is intended to be closed and may have a logically low level when the IGBT switch 1 is intended to be open. It goes without saying that any other drive logic is likewise possible in this case. In the conventional switching mode, provision is made for the IGBT switch 1 to be either completely off or completely conductive, with the result that the switching signal 5 retains the respective logic level for a predefined period of time.

The control apparatus 4 also comprises a driver circuit 15 which is coupled between the drive circuit 16 and a control input 13 of the IGBT switch 1 and is designed to receive the driver signal 18 and to generate a control signal 7 on the basis of the driver signal 18, which control signal drives the IGBT switch 1. The control signal 7 is then fed into the control input 13 of the IGBT switch 1 by the driver circuit 15. For this purpose, the driver circuit 15 may have, for example, an internal control or gate resistance which can be used to adjust the amplification of the driver signal 18 in order to generate the control signal 7.

In particular operating modes of the inverter, it may now be necessary to carry out a rapid discharge of the intermediate circuit. The control apparatus 4 can be used to selectively "clock" an IGBT switch 1, that is to say to drive the switch in a pulsed mode in which drive pulses are fed into the control input 13 of the IGBT switch 1, the duration of which pulses is so short that the IGBT switch 1 is not yet switched to be completely conductive, but rather is briefly in a transition state between the switched-off state and the conductive state. During this time, energy from the intermediate circuit capacitor can be converted into heat when a current flows through the IGBT switch 1 and the voltage in the intermediate circuit can thus be rapidly and effectively reduced. This makes it possible, in particular, to a set a rapid discharge mode in an inverter driven in this manner, as a result of which it is advantageously possible to rapidly discharge an intermediate circuit capacitor feeding the inverter, for example the intermediate circuit capacitor 2. In this case, it is particularly advantageous that the components of the inverter which are already present can be used for the discharge without having to install additional circuits or discharge elements such as switchable resistors or the like.

In order to implement this operating mode, the drive circuit 16 can be designed to generate the driver signal 18 in the form of a sequence of driver signal pulses with a predetermined and adjustable pulse length, with the result that the IGBT switch 1 is not completely conductive when driven with the control signal 7 during the pulse length. An exemplary possibility for such a sequence of driver signal pulses 18k is schematically illustrated in FIG. 7. In this case, the driver signal pulses 18k each have a pulse length T. This pulse length T may be short with respect to the drive duration in a conventional control mode of the IGBT switches 1. For example, the switching duration of an IGBT switch 1, during which the IGBT switch 1 is kept closed or open in a normal mode, may be approximately 100 μs. In this case, the pulse length T may be a few μs, for example between 0.2 μs and 5 μs. In this case, the pulse length T may be dependent on the physical parameters of the IGBT switch 1 and the driver circuit 15.

In order to regulate the drive pulses which are fed into the control input 13 of the IGBT switch 1, it is possible to additionally provide a regulation circuit 17 which is coupled to the drive circuit 16 and is designed to generate a regulation signal 19 for regulating the driver signal 18 and to feed said regulation signal into the drive circuit 16. Such a regulation circuit 17 is illustrated, by way of example, in FIGS. 3 to 6. The regulation circuit 17 in FIGS. 3 and 5 differs from the regulation circuit in FIGS. 4 and 6 to the effect that the regulation circuit 17 is designed to detect a first voltage signal 9 which indicates a voltage drop across the IGBT switch 1 and to generate the regulation signal 19 on the basis of the first voltage signal 9. In this case, the first voltage signal 9 can be tapped off at the collector connection 11 of the IGBT switch 1, for example. In contrast, as shown in FIGS. 4 and 6, a current measurement signal 8 for a current through the IGBT switch 1 can also be detected and the regulation signal 19 can be generated on the basis of the current measurement signal 8. For this purpose, the regulation circuit 17 may be coupled to the current sensor output 14 of the IGBT switch 1. Alternatively, it may also be possible to connect the regulation circuit 17 to both the current sensor output 14 and the collector connection 11 of the IGBT switch 1 and to generate the regulation signal 19 both on the basis of the first voltage signal 9 and on the basis of the current measurement signal 8.

In all cases, the pulse length T of the driver signal pulses 18k can be adjusted using the regulation signal 19. If, for example, the intermediate circuit voltage does not decrease or decreases by an excessively low extent, the pulse length T can be extended. Similarly, the pulse length T can be reduced, for example, in the event of an excessively high current through the IGBT switch 1. A voltage dip of the intermediate circuit voltage at the collector connection 11 of the IGBT switch 1 at the time at which the IGBT switch 1 is switched on can be monitored, for example, using the first voltage signal 9. If there is no voltage dip or the voltage dip is too low, the pulse length T can be extended. The regulation method of the regulation circuit 17 can generally be started with a short pulse length T in order to avoid overloading of the IGBT switch 1 and thus possible damage.

The regulation circuit 17 may optionally also receive further external parameters which are concomitantly included in the regulation mechanism. For example, the external parameter may comprise the temperature at the IGBT switch 1. It may also be possible to feed the voltage drop across the bridge branch associated with the respective IGBT switch 1 into the regulation circuit 17 as a second voltage signal 6 as the external parameter. This second voltage signal 6 can be used to optimize the driver signal 18 output by the drive circuit 16 for adjusting a predefined flow of current through the IGBT switch 1.

As schematically illustrated in FIGS. 5 and 6, an actuating signal 20 for adjusting an adjustable control resistance of the driver circuit 15 may be generated by the drive circuit 16 in addition to the regulation circuit 17 and may be fed into the driver circuit 15. In this case, the actuating signal 20 can be generated, for example, on the basis of the regulation signal 19. The actuating signal 20 can be used to selectively increase the resistance value of the control resistance of the driver circuit 15, with the result that the value of the drive voltage which is fed into the control input 13 of the IGBT switch 1 can be reduced. In this case, the control resistance can be adapted in any desired stages, with the result that the drive voltage and thus the flow of current through the IGBT switch 1 can be selectively regulated using the regulation circuit 17.

FIG. 8 shows a schematic illustration of a current and voltage diagram for an exemplary temporal profile of a drive pulse 18k for a semiconductor switch 1, the flow of current through the bridge branch associated with the semiconductor switch 1 and the voltage drop across this bridge branch. The corresponding temporal profiles are explained in connection with FIG. 9 which schematically illustrates a section of the voltage intermediate circuit converter in FIG. 1 in more detail. In this case, the following explanation relates to the rapid discharge mode of the intermediate circuit capacitor.

FIG. 8 shows a drive pulse 18k which clocks one of the two semiconductor switches of a bridge branch, that is to say changes it to a conductive state for a short period of time. The other of the two semiconductor switches of the bridge branch is in a closed or completely conductive state in this case. The drive pulse 18k causes the driver circuit 15 to generate a control signal 7, the profile of which is illustrated in the form of a voltage curve by way of example. The control signal 7 results in the clocked semiconductor switch drawing a current I, the temporal profile of which is illustrated by way of example in FIG. 8 using the current curve 21. The voltage UB dropped across the bridge branch is illustrated parallel thereto with the reference symbol 22.

The rise of the current through the semiconductor switch first of all results in a voltage dip which is indicated with the negative voltage area 22a. After the maximum current Imax has been reached, the voltage UB increases again and causes a voltage overswing which is indicated with the positive voltage area 22b. The relationship between the maximum current Imax and voltage UB is $$I_{max}=L_k^{-1}\int U_B(t)dt=L_k^{-1}\cdot A_{pos}=L_{kp}^{-1}\cdot A_{neg},$$

where $A_{pos}$ and $A_{neg}$ are the respective area values of the positive voltage area 22b and negative voltage area 22a.

The instantaneous maximum current $I_{max}$ can be determined by detecting the values for $A_{pos}$ and/or $A_{neg}$. This can be effected, for example, by means of the second voltage signal 6 which is fed into the regulation circuit 17. In the regulation circuit 17, the second voltage signal 6 can be integrated, for example, using an integrator circuit. As a result of the integration of the second voltage signal 6, the regulation circuit 17 can drive the drive circuit 16 to adapt the drive signal 18, with the result that the deviation of the maximum current intensity $I_{max}$ from a desired value can be minimized. On account of different tolerances, for example mechanical tolerances, such a deviation may occur and may adversely affect a reliable rapid or emergency discharge. The rapid or emergency discharge can be optimized by regulating the deviation to zero in the regulation circuit 17.

Figure 9:
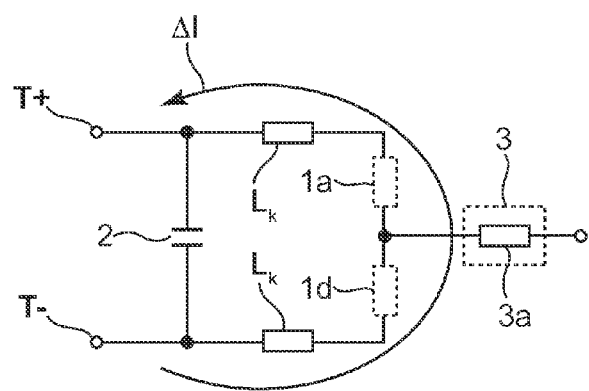
FIG. 9 shows a schematic illustration of a section of the voltage intermediate circuit converter in FIG. 1 in more detail.

It is clear from FIG. 9 that the same current change ΔI occurs both during clocking and in the normal mode during switching-off of the semiconductor switch 1a. In both cases, this results in the voltage drops across the inductances in the commutation circuit, which voltage drops are the same to a first approximation. The inductances may be, for example, parasitic or intrinsic inductances of the intermediate circuit capacitor 2, of the semiconductor switches 1a and 1d or of the connection technology used for the current-carrying lines. These inductances may be illustrated as the total inductance $2L_k$ of the commutation circuit. The total inductance $2L_k$ of the commutation circuit can be determined, for example, by simulating or measuring the components. FIG. 9 illustrates the total inductance $2L_k$, by way of example, as two inductance components $L_k$ arranged on the low-voltage and high-voltage sides.

Instead of the second voltage signal 6, it is also possible to use, for example, the first voltage signal 9 for feeding into the regulation circuit 17 and for regulating the drive circuit 16. The drive circuit 16 can be regulated, for example, in the rapid discharge mode or in the normal mode. In the normal mode, the commutation current ΔI flows through the inductors 3a of the electrical machine 3 and, from there, back into the intermediate circuit capacitor 2 via other bridge branches. In the intermediate circuit capacitor, the current can be determined using a phase current sensor system of the electrical machine 3, for example. The accuracy of the regulation circuit 17 and thus of the rapid discharge mode can be considerably improved by comparing the phase currents detected by the phase current sensor system with the commutation currents determined in the regulation circuit 17.

The control apparatus 4 can also be checked for functionality with the aid of the regulation circuit 17 and the detection of the first and second voltage signals 6 and 9, respectively. If, for example, the rapid discharge mode is activated, for example when initializing the inverter 10, it is possible to check whether the maximum current $I_{max}$ detected is in a plausible range. Similarly, the regulation circuit 17 can be adjusted in such a manner that it can reproduce the desired value for the maximum current $I_{max}$ in a sufficiently effective manner over a predefined current range. In addition, the regulation circuit 17 also makes it possible to monitor the rapid or emergency discharge mode. The first and second voltage signals 6 and 9 infer the discharge power of the rapid discharge. This makes it possible to determine, for example, whether the voltage of the intermediate circuit capacitor 2 is not operating as expected during the rapid or emergency discharge mode on account of a contactor which cannot be opened or on account of a control apparatus 4 which is not operating correctly.

Figure 10:
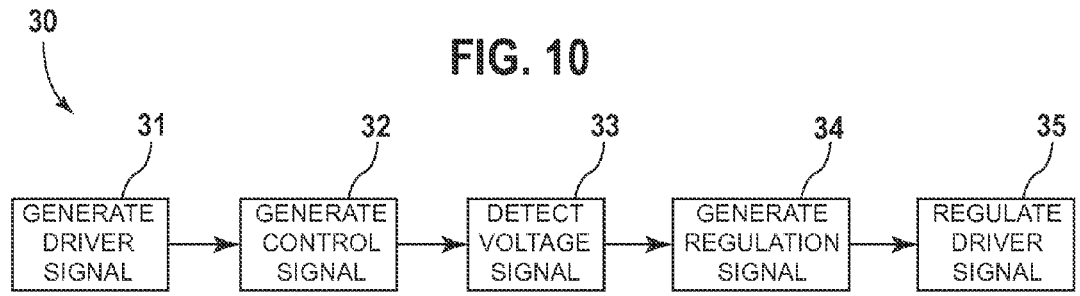
FIG. 10 shows a schematic illustration of a method for driving an inverter according to another embodiment of the invention.

FIG. 10 shows a schematic illustration of a method 30 for driving an inverter, in particular an inverter 10 in the electrical drive system 100 (illustrated in FIG. 1) of an electrically operated vehicle. In a first step 31, the method 30 comprises generating a driver signal for at least one of the semiconductor switches of the inverter, the driver signal having a sequence of driver signal pulses. In a second step 32, the driver signal is then amplified in order to generate a control signal which drives the at least one semiconductor switch. In this case, the driver signal pulses each have a predetermined and adjustable pulse length, with the result that the semiconductor switch is not completely conductive when driven with the control signal during the pulse length.

In step 33, a voltage signal dependent on the voltage dropped across the semiconductor switch can be detected during switching-off of the semiconductor switch, for example at a collector connection of the semiconductor switch or via a bridge branch of the inverter. In step 34, a regulation signal dependent on the voltage signal can then be generated. The driver signal can then be regulated in step 35 with the aid of the regulation signal.

The regulation signal can be formed by first of all integrating the voltage signal during switching-off of the semiconductor switch, for example in order to determine the area values of the positive voltage area 22b and negative voltage area 22a, as schematically illustrated in FIG. 8. The maximum current intensity $I_{max}$ through the semiconductor switch, which is dependent on the integrated voltage signal, can then be determined using these area values. The regulation signal can then be formed, for example, on the basis of the difference between the maximum current intensity $I_{max}$ determined and a predefinable desired value for the maximum current intensity.

The method 30 can, in principle, be carried out in any operating mode of the inverter. In particular, the method 30 can be carried out in a conventional normal mode of the inverter. In this case, one or more of the semiconductor switches which are intended to be in a closed state can be driven in a pulsed manner during this period of time in a freewheeling mode or in the regulation mode, for example. As a result, the functionality of the control apparatus can be checked by evaluating the maximum current intensity and by means of the comparison with the predefinable desired value, for example by checking whether the maximum current intensity in the semiconductor switches is in a range which is plausible for the control apparatus. This makes it possible to ensure that the control apparatus is operating correctly at any time during operation of the inverter.

In order to implement a monitoring functionality in the normal mode, it is possible to carry out the steps of detecting the phase currents for the electrical machine which are output by the inverter, comparing the detected phase currents with the voltage signals dependent on the voltages dropped across the semiconductor switches and adjusting the regulation signal on the basis of the comparison. That is to say, the phase currents in the phase lines of the electrical machine 3 can be detected in the normal mode using an existing sensor circuit 51 and can be used to check the plausibility of and to check the voltage signals dependent on the voltages dropped across the semiconductor switches.

It is particularly advantageous to carry out the method 30 in an "active short circuit" of the inverter, that is to say in a mode in which the motor windings of the electrical machine can be safely short-circuited in the event of a fault. For example, the "active short circuit" can be activated after a fault has occurred, for example in the event of failure of the voltage supply of the control regulation system, in the event of an accident involving the vehicle or in the case of other situations which endanger the operational reliability of the electrical drive system, with the result that all semiconductor switches on one bridge side of the bridge branches, for example the high-side switches, are changed to a closed state and all semiconductor switches on the respective other bridge side of the bridge branches, for example the low-side switches, are changed to an open state. It goes without saying that the high-side and low-side switches can each also be driven in the opposite way. The electrical machine can therefore be short-circuited safely and reliably via the closed semiconductor switches, in particular because it is possible to determine whether the rapid discharge is operational. For this purpose, the method 30 can provide reliable feedback relating to the actual discharge power in the rapid discharge mode, with the aid of which it is possible to detect other defects, for example the occurrence of contactors which cannot be opened or defects in the driving of the semiconductor switches.

What is claimed is:

1. A control apparatus for driving a semiconductor switch of an inverter, the apparatus comprising:
   a drive circuit which is configured to generate a driver signal on the basis of a switching signal generated by a control regulation system of the inverter;
   a driver circuit which is coupled between the drive circuit and a control input of the semiconductor switch and is configured to
      receive the driver signal and to generate, on the basis of the driver signal, a control signal which drives the semiconductor switch, and
      feed said control signal into the control input of the semiconductor switch; and
   a regulation circuit which is coupled to the drive circuit and is configured to
      detect, at a collector connection of the semiconductor switch or at a bridge branch of the inverter, a voltage signal dependent on a voltage across the semiconductor switch during switching-off of the semiconductor switch,
      integrate the voltage signal during switching-off of the semiconductor switch, to determine a maximum current intensity, on the integrated voltage signal, through the semiconductor switch,
      generate, based on the difference between the maximum current intensity determined and a predetermined value for the maximum current intensity, a regulation signal to regulate the driver signal,
      feed the regulation signal into the drive circuit.

2. The control apparatus according to claim 1, the drive circuit configured to generate the driver signal in the form of a sequence of driver signal pulses with an adjustable pulse length, with the result that the semiconductor switch is not completely conductive when driven with the control signal during the pulse length.

3. The control apparatus according to claim 2, the pulse length being able to be adjusted on the basis of the voltage signal in such a manner that the semiconductor switch has a predetermined current value when driven with the control signal.

4. The control apparatus according to claim 1, the driver circuit having an adjustable control resistance for generating the control signal, and the drive circuit configured to generate an actuating signal for adjusting the adjustable control resistance on the basis of the regulation signal and to feed said actuating signal into the driver circuit.

5. The control apparatus according to claim 1 which is configured to drive an IGBT switch.

6. The control apparatus according to claim 1, the inverter having a half-bridge circuit, and the drive circuit configured to drive in each case one of the semiconductor switches of a bridge branch with the driver signal and to permanently close the other semiconductor switch of the bridge branch.

7. A drive system for an n-phase electrical machine, where $n \geq 1$, having:
   an intermediate circuit capacitor which is connected to two input voltage connections (T+; T−);
   an inverter having a multiplicity of semiconductor switches, which inverter is coupled to the intermediate circuit capacitor, is fed with electrical energy from the intermediate circuit capacitor and is configured to generate an n-phase supply voltage for the electrical machine;
   a multiplicity of control apparatuses according to claim 1 respectively which are each configured to generate a control signal for driving one of the semiconductor switches of the inverter; and
   a control regulation system which is coupled to the multiplicity of control apparatuses and is configured to generate switching signals for the semiconductor switches of the inverter.

8. The drive system according to claim 7, also having: a sensor circuit which is coupled to the control regulation system and is configured to detect the phase currents for the electrical machine which are output by the inverter, the control regulation system also configured to compare the detected phase currents with the voltage signals dependent on voltages across the semiconductor switches and to drive the regulation circuits of the multiplicity of control apparatuses on the basis of the comparison in order to adjust the regulation signals.

9. A method for driving an inverter, having the steps of:
generating a driver signal for at least one of the semiconductor switches of the inverter, the driver signal having a sequence of driver signal pulses;
amplifying the driver signal in order to generate a control signal which drives the at least one semiconductor switch;
detecting, at a collector connection of the semiconductor switch or via a bridge branch of the inverter, a voltage signal dependent on the voltage dropped across the semiconductor switch during switching-off of the semiconductor switch;
integrating the voltage signal during switching-off of the semiconductor switch;
determining a maximum current intensity, on the integrated voltage signal, through the semiconductor switch;
generating a regulation signal on the basis of the difference between the maximum current intensity determined and a predetermined value for the maximum current intensity; and
regulating the driver signal using the regulation signal.

10. The method according to claim 9, the driver signal pulses each having a predetermined and adjustable pulse length, with the result that the semiconductor switch is not completely conductive when driven with the control signal during the pulse length.

11. The method according to claim 9, also having the steps of: detecting the phase currents for the electrical machine which are output by the inverter; comparing the detected phase currents with the voltage signals dependent on the voltages dropped across the semiconductor switches; and adjusting the regulation signal on the basis of the comparison.

* * * * *